(12) United States Patent
Eckels

(10) Patent No.: US 6,169,404 B1
(45) Date of Patent: Jan. 2, 2001

(54) VIBRATION CANCELLATION FOR C-SHAPED SUPERCONDUCTING MAGNET

(75) Inventor: Phillip William Eckels, Florence, SC (US)

(73) Assignee: General Electric Company, Milwaukee, WI (US)

(*) Notice: Under 35 U.S.C. 154(b), the term of this patent shall be extended for 0 days.

(21) Appl. No.: 09/216,221

(22) Filed: Dec. 18, 1998

(51) Int. Cl.[7] ................................................. G01R 33/20
(52) U.S. Cl. ............................................. 324/320; 324/318
(58) Field of Search .................................. 324/320, 322, 324/321, 318

(56) References Cited

U.S. PATENT DOCUMENTS 5,548,653 * 8/1996 Pla et al. ................................. 381/71
5,731,704 * 3/1998 Schnur et al. ......................... 324/320
5,942,898 * 8/1999 Petropoulos et al. ................. 324/318

* cited by examiner

Primary Examiner—Christine K. Oda
Assistant Examiner—Dixomara Vargas
(74) Attorney, Agent, or Firm—Irving M. Freedman; Christian G. Cabou; Phyllis Y. Price

(57) ABSTRACT

A vibration cancellation system for a magnetic resonance imager superconducting C-shaped magnet includes a vibration sensor at a remote end of the separated pole pieces to provide a vibration signal which is phase inverted and converted to an opposing force by a magnetoresistive actuator connected across the support member between the opposite ends of the pole pieces to cancel vibrations which would otherwise adversely affect the homogeneity of the magnetic field in the imaging region of the magnet.

17 Claims, 2 Drawing Sheets

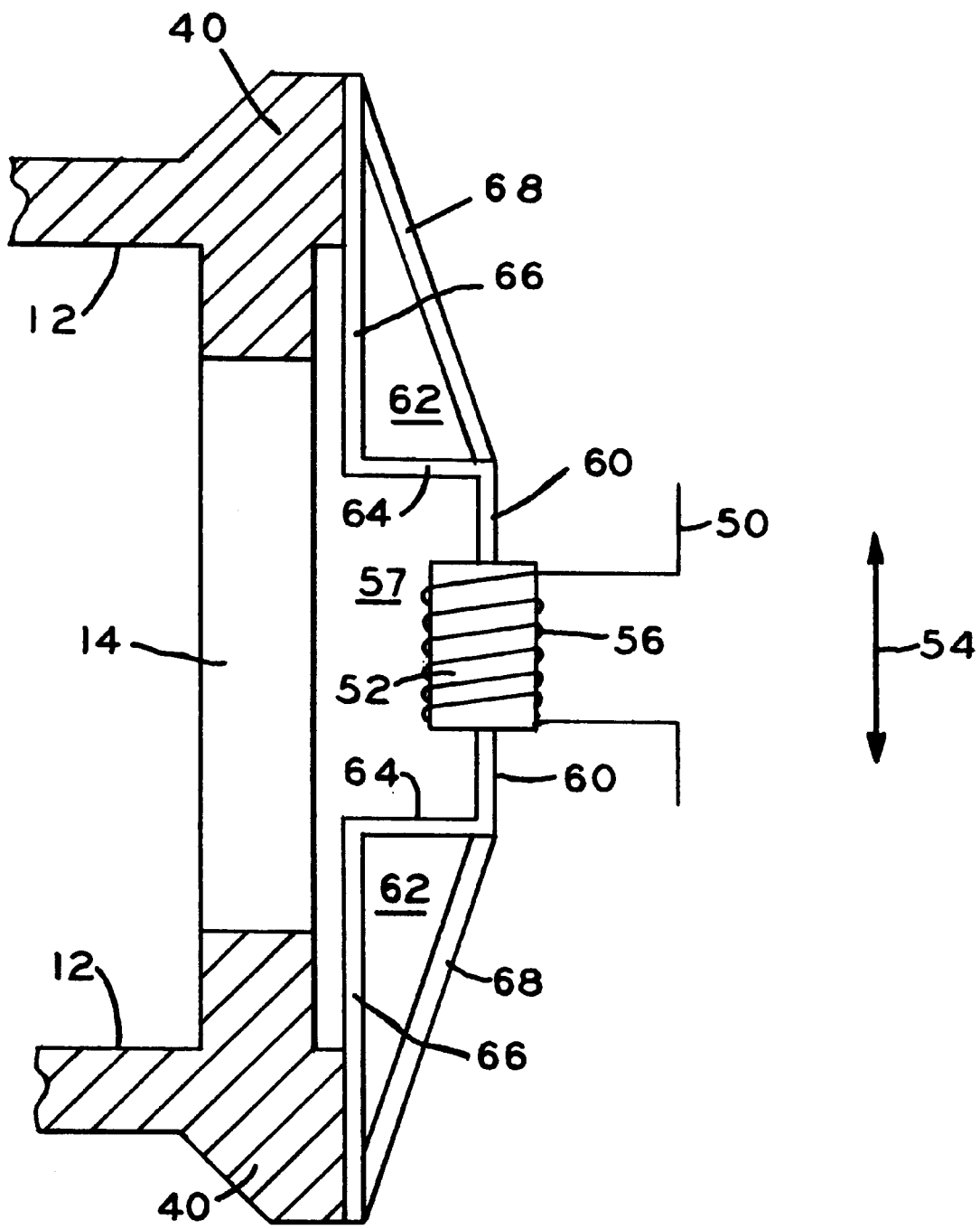
FIG_2

VIBRATION CANCELLATION FOR C-SHAPED SUPERCONDUCTING MAGNET

BACKGROUND OF INVENTION

This invention relates to a C-shaped superconducting magnet assembly for a magnetic resonance imaging system (hereinafter called "MRI"), and more particularly to improved and simplified vibration cancellation in such an assembly.

As is well known, a superconducting magnet can be made superconducting by placing it in an extremely cold environment, such as by enclosing it in a cryostat or pressure vessel containing liquid helium or other cryogen. The extreme cold ensures that the magnet coils can be made superconducting, such that when a power source is initially connected to the coil (for a relatively short period) current continues to flow through the coils even after power is removed due to the absence of resistance, thereby maintaining a strong magnetic field. Superconducting magnets find wide application in the field of MRI.

Imaging quality is dependent on the production of a strong yet highly homogeneous and stabe magnetic field in the imaging region of the superconducting magnet.

In order to compensate for the inhomogeneities in MRI magnets, various arrangements including ferromagnetic shim materials and correction coils have been used. However, even after extensive shimming to provide the required magnetic field homogeneity for a particular installation, it has been found that superconducting magnets are subject to vibration which can adversely affect field homongeneity and imaging quality, particularly the so-called C-shaped configuration in which heavy magnet elements are supported in a cantilever manner. Even light vibrations induced by people walking in the vicinity or other normal vibrations such as vehicles passing outside the installation encountered during use can adversely affect the imaging quality, particularly if the vibrations induce resonant frequency vibrations in the magnet structure.

SUMMARY OF INVENTION

Thus, there is a particular need for a system to cancel vibrations of the superconducting magnet structure to avoid the aforementioned problems.

In accordance with one form of the subject invention, a vibration cancellation system for a cantilever supported magnet structure includes a vibration sensor at a remote unsupported end to provide a signal responsive to vibration which is phase inverted and amplified for application to an actuator which provides an out of phase force for application to a support member for the supported end of the magnet structure. The out of phase force is applied through a rigid structure interposed between the magnetoresistive actuator and separated portions of the support member. In the case of a C-shaped magnet, the vibration sensor is at the unsupported end of the separated pole pieces and the force can be applied to the connecting member between the opposite ends of the pole pieces.

DESCRIPTION OF DRAWINGS

FIG. 2 is an enlarged view of a portion of FIG. 1 with details of the antivibration actuator system added.

DETAILED DESCRIPTION OF THE INVENTION

Figure 1:
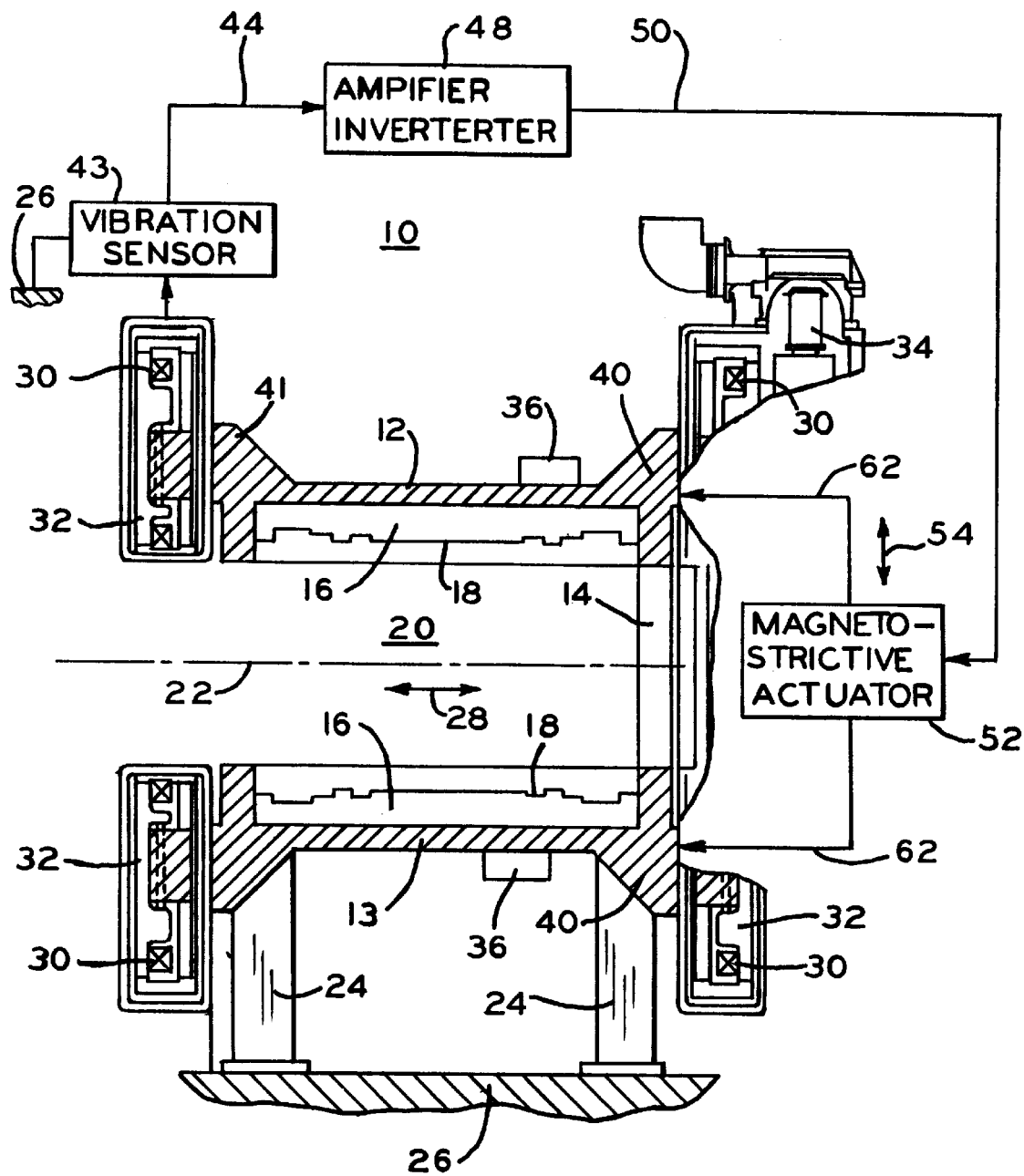
FIG. 1 is a simplified cross-sectional side view of a C-shaped superconducting magnet including the subject invention.

Referring to FIGS. 1 and 2, superconducting magnet 10 includes spaced parallel pole pieces 12 and 13 separated and supported at one end by a pair of connecting members or posts 14. Pole pieces 12 and 13 and posts 14 are of non-magnetic material such as stainless steel. Pole faces 16 are shaped 18 to improve magnetic field homogeneity within imaging region 20 along axis 22 of superconducting magnet 10. Supports 24 secure magnet 10 to floor 26.

The main magnetic field, Bo, indicated generally by arrow 28 within imaging region 20 is generated by magnet coils shown generally as 30 within cryogen vessels 32 cooled by cryocooler 34. Magnetic field shimming apparatus such as correction coils (not shown) within cryogen vessels 32 and passive shims in external shim drawers indicated generally as 36 compensate for magnetic field inhomogeneities within imaging region 20 in the manner well known in the art.

However, the relatively heavy cantilevered upper pole piece 12 supported at only one end 40 is subject to vibration, particularly at the unsupported distal or remote end 41. Such vibrations and deflection of pole piece 12 may be caused by matters as simple as footsteps, building vibration, or movements of equipment or vehicles in the area surrounding the installation of superconducting magnet 10 and its associated MRI equipment. Such deflections can be particularly pronounced in the event of vibrations which are of the resonant frequency of the pole pieces. However, even very small deflections of pole piece 12 or relative movement of pole faces 16 can, and do, adversely affect the homogeneity of magnetic field 28.

Vibration sensor 43 is secured between distal or remote cantilever-supported end 41 and floor 26 to provide an electrical vibration signal 44 responsive to the vibration of end 41 of pole piece 12 relative to the floor. Vibration sensor 43 may be a force transducer such as the type 8200 vibration sensor sold by Bruel Kjaer of Naerum, Denmark.

Vibration signal 44 is provided to electronic amplifier and phase inverter 48 which provides an amplified signal 50 the phase of which is opposite to that of vibration signal 44. Phase inverted amplified signal 50 is provided to magnetostrictive actuator 57 which includes magnetostriction element 52 and surrounding self-shielded coils 56 as shown in FIG. 2.

Magnetostrictive element 52 expands and contracts in accordance with applied phase inverted drive signal 50 applied from amplifier inverter 48 across coil 56 which surrounds magnetoresistive material 52, that is the electrical drive signal is converted to a mechanical motion opposite to the vibration sensed by vibration sensor 43. The output force or movement 54 of actuator 57 is applied across connecting member or post 14 to oppose and cancel the vibration sensed by vibration sensor 44 as described in detail below.

The coil is a self-shielded coil well known to those skilled in the art of gradient coil design for MRI units. Magnetostrictive element 52 is a magnetic material which changes in dimension in accordance with changes in the magnetic field provided to it by coil 56 arising from reorientation of atomic magnetic moments of the material which may, for example, be Terfenol-D, an alloy of terbium, dysprosium and iron, with the diameter determined by the force required. Actuator 57 could be a piezoelectric cell, such as, for example, type PZT, to convert the electrical signal 50 to a responsive mechanical signal.

Magnetostrictive actutator 52 thus provides a force or motion indicated by arrow 54 which is phase opposed to the vibration sensed by vibration sensor 44. Force 54 is transmitted to the ends 40 of pole pieces 12 through rigid structures 62 interposed between the end members 60 of magnetostrictive element 52 and ends 40 of pole pieces 12.

Rigid structures 62 comprise triangular assemblies formed by horizontal members 64, vertical members 66 and diagonal connecting members 68 as best shown in FIG. 2 supported. Force or motion 54 is thus applied to supported end 40 of pole pieces 12 and 13 to oppose or cancel the vibrations applied to the opposite distal end 41. Force 54 opposes vibrations of end 41 of pole piece 12 to cancel magnetic field homogeneity perturbations which would otherwise result and which would cause deterioration of imaging quality in imaging region 20.

While the subject invention has been shown applied to a C-shaped superconducting magnet 10, it is applicable to other open architecture magnets such as those with a configuration of separated superconducting magnet cryogen assemblies connected by posts and in which the cryogen assemblies are subject to vibration which may be canceled in accordance with the subject invention with the inverted cancellation force of actuator 57 applied to the magnet.

While the present invention has been described with respect to certain preferred embodiments thereof, it is to be understood that numerous variations and details of construction, the arrangement and combination of parts, and the type of materials used may be made without departing from the spirit and scope of the invention.

What is claimed is:

1. In a superconducting magnet for magnetic resonance imaging including a pair of opposed pole pieces separated by a connecting member on one end thereof, pole piece vibration cancellation apparatus comprising:

superconducting magnet composed of superconducting coils to provide a magnetic field through said pole pieces to an imaging region between said pole pieces;

a vibration sensor secured to an end region remote from said connecting member of one of said pole pieces;

an electronic inverter;

said vibration sensor providing a vibration signal to said inverter responsive to said vibration;

said inverter providing an output signal out of phase with said vibration signal; and an actuator responsive to said output signal to provide a force out of phase with said vibration signal; and means to apply said force to said connecting member to oppose said vibrations to cancel magnetic field homogeneity perturbations which would otherwise result.

2. The vibration cancellation apparatus of claim 1 wherein said actuator which is responsive to said output signal is selected from the group consisting of magnetostrictive and piezoelectric actuators, the movement of which is responsive to the voltage of said output signal.

3. The vibration cancellation apparatus of claim 2 wherein said inverter is a phase inverter and amplifier.

4. The vibration cancellation apparatus of claim 1 wherein said actuator applies a vibration cancellation force to said connecting member.

5. The vibration cancellation apparatus of claim 4 wherein said connecting member includes a pair of separated ferromagnetic posts.

6. The vibration cancellation apparatus of claim 5 wherein said force opposes the vibration of said end region to oppose magnetic field inhomogeneities which would otherwise result from said vibration.

7. The vibration cancellation apparatus of claim 6 wherein said actuator is a magnetorestrictive actuator of an alloy including terbium, dysprosium and iron.

8. The vibration cancellation apparatus of claim 4 wherein said means to apply said force includes a pair of rigid members secured to said actuator and the remote ends of which are connected proximate to the end regions of said connecting member.

9. The vibration cancellation apparatus of claim 8 wherein said rigid members are each triangular in shape.

10. The vibration cancellation apparatus of claim 9 wherein said rigid members are non-magnetic.

11. The vibration cancellation apparatus of claim 10 wherein a pair of opposed pole faces are secured to said pole pieces defining said imaging region therebetween.

12. The vibration cancellation apparatus of claim 11 wherein said pole faces are shaped to improve the homogeneity of said magnetic field in said imaging region.

13. In a superconducting magnet for magnetic resonance imaging including a pair of opposed pole pieces superconducting magnetic field producing members subject to vibrations which could adversely affect the homogeneity of the magnetic field produced in the magnetic imaging region of the magnet, vibration cancellation apparatus comprising:

a vibration sensor secured to one end of one of said magnetic field producing members to provide a vibration signal responsive to vibrations of said member;

a phase inverter to provide an output signal in response to said vibration signal which is in phase opposition to said vibration signal;

a force generator to generate a force responsive to said output signal; and means to apply said force to said magnetic field producing member to oppose the vibrations sensed by said vibration sensor wherein magnetic field perturbations in said imaging region which would otherwise result from said vibrations are cancelled.

14. The vibration cancellation apparatus of claim 13 wherein said force generator is an actuator selected from the group consisting of magnetoresistive and piezoelectric actuators.

15. The vibration cancellation apparatus of claim 14 wherein said phase inverter includes an amplifier.

16. The vibration cancellation apparatus of claim 14 wherein said field producting members include pole faces with one end being separated without intervening support and said vibration sensor being connected at said one end.

17. The vibration cancellation apparatus of claim 14 wherein said superconducting magnet includes a cryogen vessel with superconducting magnet coils for each of said pole pieces.

* * * * *